United States Patent [19]
Stroet et al.

[11] Patent Number: 6,137,353
[45] Date of Patent: *Oct. 24, 2000

[54] LINEARIZED INTEGRATED FM DEMODULATOR USING A PLURALITY OF CASCADED ALL-PASS FILTERS OR A BESSEL FILTER

[75] Inventors: Peter Stroet, Sunnyvale; Rishi Mohindra, Milpitas, both of Calif.

[73] Assignee: Philips Electronics North America Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/107,184

[22] Filed: Jun. 29, 1998

[51] Int. Cl.[7] .............................. H03D 3/06; H03H 11/18
[52] U.S. Cl. ...................... 329/336; 329/341; 455/214; 327/255; 327/290; 327/557
[58] Field of Search .................... 329/336, 341, 329/342, 343; 455/214; 327/255, 290, 557

[56] References Cited

U.S. PATENT DOCUMENTS

| | | |
|---|---|---|
| 4,064,361 | 12/1977 | Kustka et al. .................. 329/336 |
| 4,523,329 | 6/1985 | Ishida et al. .................. 329/336 |
| 4,725,767 | 2/1988 | Mori .................. 323/218 |
| 4,835,792 | 5/1989 | Davarian .................. 375/80 |
| 5,043,654 | 8/1991 | Philippe .................. 323/219 |
| 5,122,879 | 6/1992 | Ito .................. 348/735 |
| 5,414,385 | 5/1995 | Worsham, Jr. .................. 329/337 |
| 5,781,418 | 7/1998 | Chang et al. .................. 363/16 |

FOREIGN PATENT DOCUMENTS

2279526  1/1995  United Kingdom ............ H03D 3/00

Primary Examiner—Siegfried H. Grimm
Attorney, Agent, or Firm—Brian J. Wieghaus

[57] ABSTRACT

An approach for demodulating a frequency-modulated signal involves processing a frequency-modulated signal with a phase shifter network to provide a demodulated signal that has a relatively constant amplitude around the center frequency of the frequency-modulated signal and that exhibits a relatively linear phase change over an operational frequency range. Embodiments of the invention include a phase shifter network, using N number of cascaded all-pass filters, that receives as an input a limited amplitude signal and outputs a phase-shifted limited amplitude signal that is mixed with the limited amplitude signal. The phase shifter network may also comprise a low-pass bessel filter.

26 Claims, 6 Drawing Sheets

LINEARIZED INTEGRATED FM DEMODULATOR USING A PLURALITY OF CASCADED ALL-PASS FILTERS OR A BESSEL FILTER

FIELD OF THE INVENTION

The invention relates to signal processing, and more specifically, to demodulating frequency-modulated signals.

BACKGROUND OF THE INVENTION

Frequency Modulation (FM) is a method of modulation in which the frequency of a wave is varied in response to a modulating wave. The wave in which frequency is varied is termed the carrier wave and the modulating wave is called the signal. A frequency-modulated electromagnetic wave has a constant amplitude and is much less susceptible to interference from both natural and artificial sources of electromagnetic radiation relative to an amplitude-modulated electromagnetic wave where such sources can cause static. As a result of its favorable performance characteristics, FM is used in a broad range of communication systems such as radio and more recently in personal communication systems (PCS) such as wireless computers and wireless telephony.

An important characteristic of FM based systems is how accurately the original information can be recovered from the frequency-modulated information. The process of recovering original information from frequency-modulated information is typically referred to as demodulation. In an ideal FM system, demodulating a frequency-modulated signal provides only the information that was originally modulated. For example, frequency modulating and subsequently demodulating a 1 KHz signal yields only a 1 KHz signal. In practice however, demodulation produces not only the original signal that was modulated, but also other harmonics. In the prior example, the demodulated information may contain partials at 2 kHz, 3 kHz, 4 kHz, etc. This other information is undesirable because it adversely affects the performance of FM systems. Thus, the power level of the undesirable harmonic distortion is ideally much less than the power of the desired information.

Figure 1:
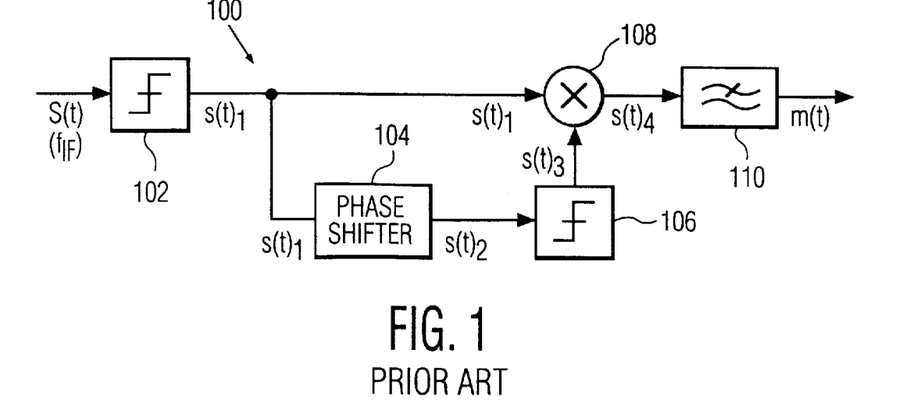
FIG. 1 is a block diagram illustrating a conventional demodulator for demodulating a frequency-modulated signal.

FIG. 1 illustrates a conventional FM delay line demodulator 100 for demodulating a frequency-modulated signal. Demodulator 100 includes a limiter 102, a phase shifter 104, a limiter 106, a mixer 108 and a filter 110. A frequency-modulated input signal, designated as s(t) and having a center frequency of $f_{IF}$, is provided to limiter 102. As is well known in the art, a limiter processes an input signal and provides an output signal having a constant, predetermined amplitude, regardless of any amplitude variations that may be present in the input signal. Limiters are used in FM demodulators when circuitry in the demodulator is sensitive to amplitude variations.

Limiter 102 processes input signal s(t) and provides a limited input signal $s(t)_1$, having a constant and predetermined amplitude, to both phase shifter 104 and mixer 108. As is well known in the art and described in more detail hereinafter, mixer 108 is sensitive to variations in signal amplitude and therefore all input signals to mixer 108 must have relatively constant amplitude.

Phase shifter 104 performs a frequency-dependent phase shift of $s(t)_1$ to provide a phase-shifted signal $s(t)_2$. The phase shift is ideally 90 degrees at the center frequency $f_{IF}$ of s(t). As is described in more detail hereinafter, signal $s(t)_2$ characteristically includes amplitude and frequency distortion added by phase shifter 104. Signal $s(t)_2$ is processed by limiter 106 to generate a phase-shifted signal $s(t)_3$, having a predetermined and constant amplitude, that is provided to mixer 108. Mixer 108 multiplies signal $S(t)_3$ and signal $s(t)_1$ to generate a signal $s(t)_4$ that contains the modulating signal m(t), along with a double frequency term at $2f_{IF}$. Signal $S(t)_4$ is processed by filter 110 to select signal m(t) at the output. Filter 110 is typically a low-pass filter to remove the higher frequency components including noise.

Figure 2:
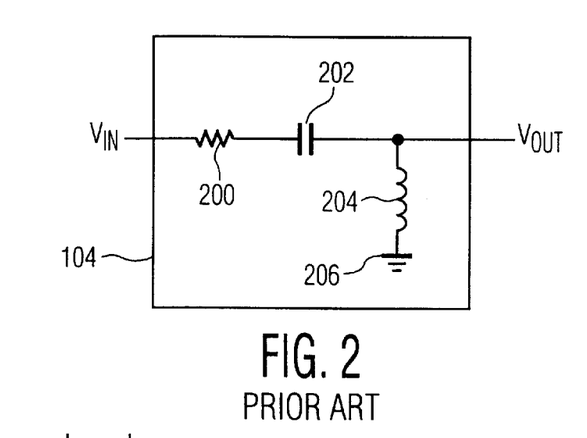
FIG. 2 is a block diagram illustrating a conventional resistor-capacitor-inductor (RCL) circuit implementation of a phase shifter used in the block diagram of FIG. 1.
Figure 4:
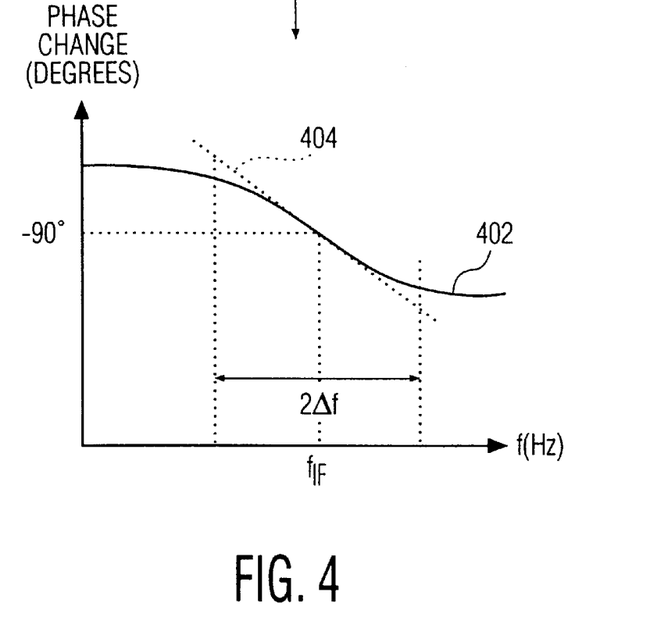
FIG. 4 is a graph illustrating the phase change over frequency of the phase-shifted output signal of the RCL circuit of FIG. 2.

Phase shifter 104 is conventionally implemented as a resistor-capacitor-inductor (RCL) circuit. FIG. 2 illustrates a conventional RCL implementation of phase shifter 104. Phase shifter 104 includes a resistor 200 and a capacitor 202 connected in series between an input voltage ($V_{IN}$) and an output voltage ($V_{OUT}$). An inductor 204 is connected between $V_{OUT}$ and a ground 206. The operation of phase shifter 104 as illustrated in FIG. 4 is characterized by the following equations:

$$f_{IF} = \frac{1}{2\pi\sqrt{LC}} \quad (1)$$

$$Q = \frac{2\pi f_{IF} L}{R} \quad (2)$$

The conventional RCL implementation of phase shifter 104 has several disadvantages compared to an ideal phase shifter. First, when used to process modulated signals having a relatively low center frequency ($f_{IF}$) it becomes difficult to obtain a large reactance for "L", as expressed by the numerator. For example, for a Q of 0,1 and a practical resistance of 10K ohms, a 5 mH inductance is needed, which is hard to integrate and is generally impractical for integrated applications. The term "Q" is well understood in the art to mean the quality factor of an RCL circuit. To obtain a relatively high reactance in the numerator of equation (2) above, the value of L must be relatively large, which can be difficult to implement in integrated semiconductor devices because of the large amount of space required to form a large discrete inductor component.

Second, the RCL implementation of phase shifter 104 produces an undesirable amount of amplitude and phase (AM-PM) distortion, requiring the use of limiter 106 and limiting the useful applications for demodulator 100. Because of the characteristically non-linear phase shift provided by phase shifter 104, the demodulated signal m(t) has a relatively low SINAD at low center frequencies such as about 60 KHz. The term "SINAD" is well understood in the art as a figure of merit to express the power (dB) ratio between the ground harmonic and the integration of the higher harmonics ($2f_o$, $3f_o$, etc., where fo is the frequency of m(t)). The amplitude and frequency distortion of phase shifter 104 are explained in more detail with reference to the graphs of FIGS. 3 and 4.

Figure 3:
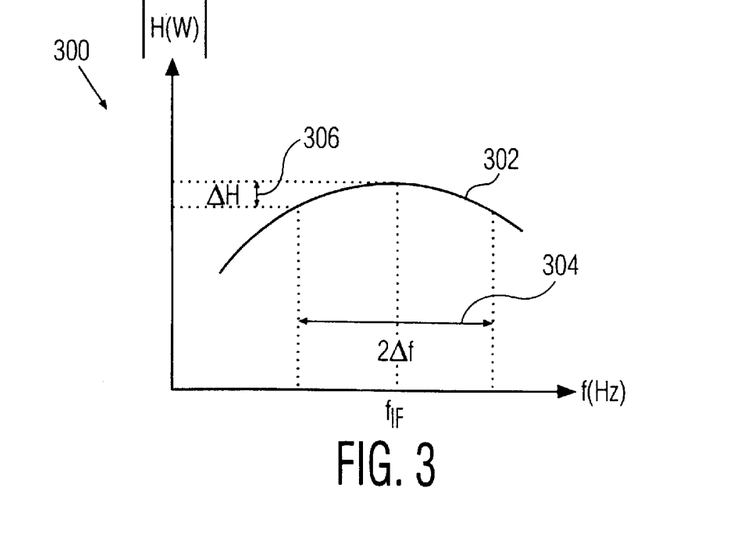
FIG. 3 is a graph illustrating a transfer function for the RCL circuit of FIG. 2.

FIG. 3 is a graph 300 illustrating the transfer function 302 of the RCL circuit of phase shifter 104 as a function of frequency. As illustrated by graph 300, the operation of phase shifter 104 over a frequency range 304 (2Δf) with respect to the center frequency ($f_{IF}$) results in a change 306 (ΔH) in amplitude of the phase-shifted output signal $s(t)_2$ of phase shifter 104. Thus, the amplitude of $s(t)_2$ varies (is distorted) over the frequency range of $f_{IF}$–Δf to $f_{IF}$+Δf. Since mixer 108 is very sensitive to changes in amplitude, the phase-shifted output signal $s(t)_2$ of phase shifter 104 must be processed by limiter 106 to provide a signal $s(t)_3$ having a constant amplitude.

FIG. 4 is a graph 400 illustrating the phase change (degrees) over frequency (Hz) of phase shifted-shifted output signal s(t)$_2$ of phase shifter 104, as indicated by line 402. Because of the nonlinear operation of phase shifter 104, as represented by line 402, the demodulated signal m(t) (FIG. 1) has a relatively low SINAD, thereby making demodulator 100 generally unsuitable for high-SINAD applications, such as high quality wireless communications. For comparison purposes, graph 400 includes a line 404 representing an ideal linear phase shift over frequency.

Based on the need to demodulate FM signals and the limitations in the prior approaches, an approach for demodulating FM signals that does not require the use of inductors and that provides a demodulated signal with a SINAD sufficiently high for wireless communication applications is highly desirable.

SUMMARY OF THE INVENTION

According to one aspect of the invention, a demodulator for processing a frequency-modulated input signal and providing an output signal comprises a limiter responsive to a frequency-modulated input signal for providing a limited-amplitude signal having a predetermined amplitude. A phase shifter network is coupled to the limiter and includes a plurality of filters. The phase shifter network is responsive to the limited amplitude signal and provides a phase-shifted limited amplitude signal. A signal mixer is coupled to both the limiter and the phase shifter network, the signal mixer being responsive to both the limited amplitude signal and the phase-shifted limited amplitude signal to generate an output signal having a limited amplitude signal component and a phase-shifted limited amplitude signal component According to another aspect of the invention, a method for processing a frequency-modulated signal and providing an output signal comprises the steps of processing the frequency-modulated signal to generate a limited-amplitude signal having a predetermined amplitude, processing the limited-amplitude signal with a plurality of all-pass filters to generate a phase-shifted limited amplitude signal and processing the limited-amplitude signal and the phase-shifted limited amplitude signal to generate an output signal having a limited amplitude signal component and a phase-shifted limited amplitude component.

According to another aspect of the invention, a demodulator for processing a frequency-modulated input signal and generating an output signal comprises a first limiter responsive to a frequency-modulated input signal for providing a limited-amplitude signal having a predetermined amplitude. A low-pass bessel filter is coupled to the limiter, the low-pass bessel filter being responsive to the limited-amplitude signal for generating a first phase-shifted limited-amplitude signal. A second limiter is coupled to the low-pass bessel filter and is responsive to the first phase-shifted limited-amplitude signal to generate a second phase-shifted limited-amplitude signal. A signal mixer coupled to both the first limiter and the second limiter is responsive to the limited-amplitude signal and the second phase-shifted limited-amplitude signal to generate an output signal having a limited amplitude signal component and a phase-shifted limited amplitude signal component.

Other aspects and features of the invention will become apparent from the following description and claims.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE PREFERRED EMBODIMENT

In the following description, for the purposes of explanation, specific details are set forth in order to provide a thorough understanding of the invention. It will be apparent however, that the invention may be practiced without these specific details. In other instances, well-known structures and devices are depicted in block diagram form in order to avoid unnecessarily obscuring the invention.

FUNCTIONAL OVERVIEW

An approach for demodulating a frequency-modulated signal involves processing a frequency-modulated signal with a phase shifter network to provide a demodulated signal that has a relatively constant amplitude around the center frequency of the frequency-modulated signal and that exhibits a relatively linear phase change over an operational frequency range. The demodulated signal has a relatively high SINAD, making the approach suitable for high-SINAD applications, such as telecommunications and wireless telephony. The approach also avoids the use of inductors in the phase shifter network, providing a compact demodulator that is well suited for integrated circuit applications. Embodiments of the invention include, but are not limited to, a phase shifter network comprising N number of all-pass filters and a phase shifter network comprising a low-pass bessel filter, both of which are described in more detail hereinafter.

DETAILED DESCRIPTION

Figure 5:
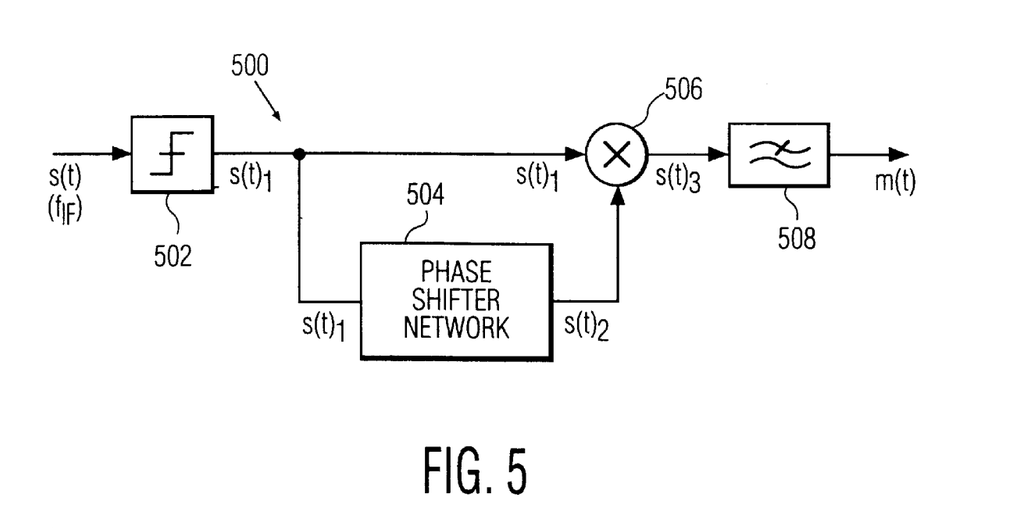
FIG. 5 is a block diagram illustrating a demodulator for demodulating a frequency-modulated signal according to an embodiment of the invention.

FIG. 5 illustrates a demodulator 500 for demodulating a frequency-modulated signal according to an embodiment of the invention. Demodulator 500 includes a limiter 502, a phase shifter network 504, a mixer 506 and a filter 508. Limiter 502 processes input signal s(t) and provides a limited input signal $s(t)_1$, having a constant and predetermined amplitude, to both phase shifter network 504 and mixer 506. Phase shifter network 504 performs a frequency-dependent phase shift of $s(t)_1$ of ninety (90) degrees at the center frequency $f_{IF}$ of $s(t)_1$, providing a phase-shifted signal $s(t)_2$. Mixer 506 combines $s(t)_1$ with $s(t)_2$ to provide a signal $s(t)_3$ that contains signal m(t) and higher frequency components, namely $s(t)_1$ at $f_{IF}$, $2f_{IF}$, $3f_{IF}$, etc. Signal $s(t)_3$ is processed by filter 508 to remove higher order components of $s(t)_1$, namely $s(t)_1$ at $f_{IF}$, $2f_{IF}$, $3f_{IF}$, etc., providing output signal m(t).

Demodulator 500 is implemented in preferred embodiments as a differential circuit wherein each of the illustrated connection lines includes two connection lines, one-hundred eighty (180) degrees out of phase with respect to each other, to increase the supply rejection ratio. However, for purposes of simplicity of illustration, connection lines are depicted as a single line in FIG. 5.

All-Pass Filter Network

Figure 6:
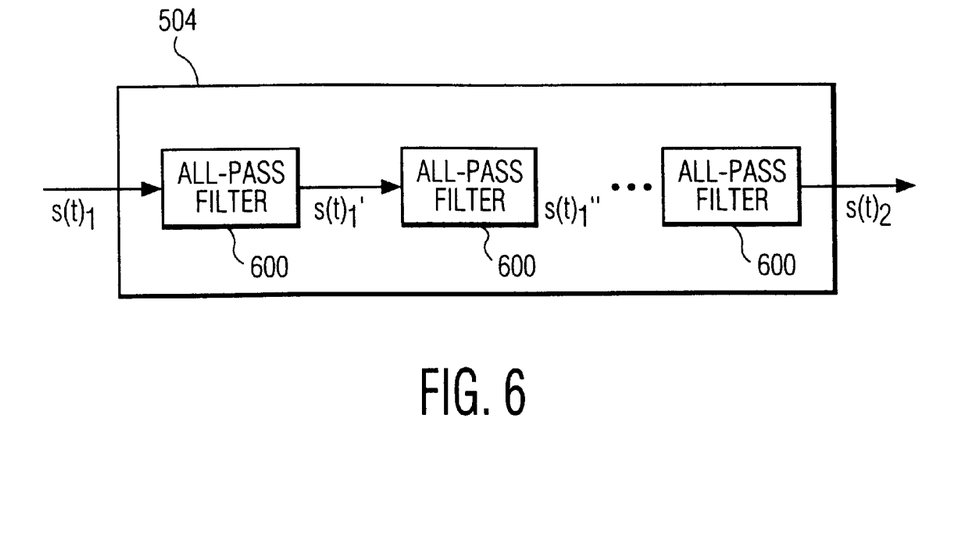
FIG. 6 is a block diagram illustrating a phase shifter network according to one embodiment of the invention.

FIG. 6 is a block diagram illustrating an all-pass filter network implementation of phase shifter network 504 according to an embodiment of the invention. According to this embodiment, phase shifter network 504 includes N number of all-pass filters 600 that together provide (90) degrees of phase shift of frequency-modulated input signal $s(t)_1$ with minimal distortion of the amplitude or frequency of $s(t)_1$. As described in more detail hereinafter, the all-pass filters 600 preferably provide the same amount of phase shift, i.e. (90/N) degrees each, but may instead provide different amounts of phase shift. The first all-pass filter 600 processes input signal $s(t)_1$ and provides a phase-shifted signal $s(t)_1'$. Phase-shifted signal $s(t)_1'$ is processed by the second all-pass filter 600 that provides a phase-shifted signal $s(t)_1''$. This continues until the last all-pass filter provides signal $s(t)_2$. This approach produces a relatively linear phase change of $s(t)_1$ to at least ninety (90) degrees up to the center frequency $(f_{IF})$ of $s(t)_1$.

Figure 7:
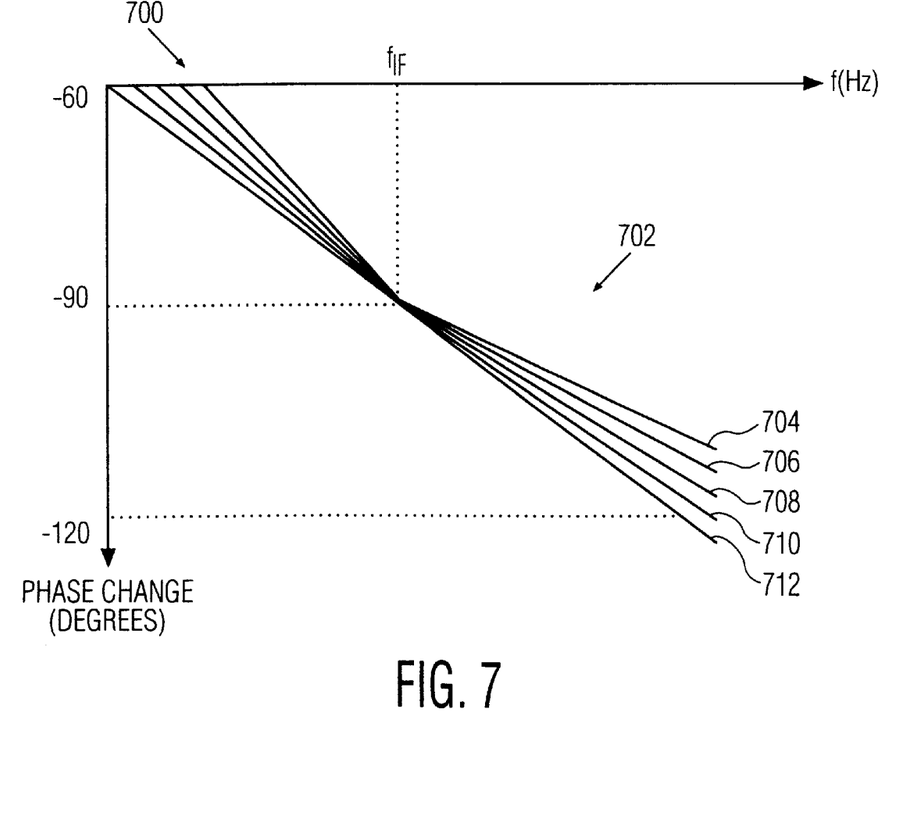
FIG. 7 is a chart illustrating the phase change (degrees) linearity as a function of frequency (Hz) of the phase shifter network of FIG. 6 according to an embodiment of the invention.

FIG. 7 is a chart 700 illustrating the phase change (degrees) linearity, as a function of frequency (Hz), of phase shifter network 504 implemented with varying numbers of all-pass filters 600 according to an embodiment of the invention. Chart 700 includes a set of phase change curves 702 that illustrate the phase change linearity of phase shifter network 504 implemented with one to five all-pass filters 600 according to an embodiment of the invention. Phase change curves 702 do not necessarily provide an actual and accurate response of phase shifter network 504, but instead are provided to illustrate the relative linearity of phase shifter network 504 when implemented with varying number of all-pass filters 600 and that the linearity of phase shifter network 504 generally improves as the number of all-pass filters 600 in phase shifter network 504 increases. Ideally, phase shifter network 504 provides a ninety (90) degree phase shift of $s(t)_1$ at the center frequency $(f_{IF})$ of $s(t)_1$.

Curve 704 generally illustrates the phase change linearity of phase shifter network 504 when implemented with a single all-pass filter 600 that provides the entire ninety (90) degrees of phase shift in $s(t)_1$ at the center frequency $(f_{IF})$ of $s(t)_1$. Curve 706 generally illustrates the phase change linearity of phase shifter network 504 when implemented with two all-pass filters 600, where each all-pass filter 600 provides forty-five (45) degrees of phase shift of $s(t)_1$ at the center frequency $(f_{IF})$ of $s(t)_1$. Curve 708 generally illustrates the phase change linearity of phase shifter network 504 when implemented with three all-pass filters 600, where each all-pass filter 600 provides thirty (30) degrees of phase shift of $s(t)_1$ at the center frequency $(f_{IF})$ of $s(t)_1$. Curve 710 generally illustrates the phase change linearity of phase shifter network 504 when implemented with four all-pass filters 600, where each all-pass filter 600 provides twenty-two and one half (22.5) degrees of phase shift of $s(t)_1$ at the center frequency $(f_{IF})$ of $s(t)_1$. Curve 712 generally illustrates the phase change linearity of phase shifter network 504 when implemented with five all-pass filters 600, where each all-pass filter 600 provides eighteen (18) degrees of phase shift of $s(t)_1$ at the center frequency $(f_{IF})$ of $s(t)_1$.

Thus, the linearity of phase sifter network 504 improves as a higher number of all-pass filters 600 are used to achieve the ninety (90) degrees of phase shift As illustrated by curve 712, a phase shifter network 504 implemented with five (5) all-pass filters 600 according to an embodiment of the invention provides a relatively linear phase change response, i.e. relatively low PM distortion. A five (5) all-pass filter 600 implementation also provides sufficiently low amplitude distortion around the center frequency $(f_{IF})$ of a modulated signal such that demodulator 500 does not require a limiter stage between phase shifter network 504 and mixer 506. According to one embodiment of the invention, the five all-pass filter 600 implementation of phase shifter network 504 produces a demodulated signal having a SINAD of approximately 60 decibels (dB), which is suitable for many communications applications, such as wireless communications. The relatively linear phase change response provided by the five (5) all-pass filter 600 implementation is achieved by operating each of the all-pass filters 600 in their respective linear ranges, thereby reducing the total distortion of phase shifter network 504. In a single all-pass filter implementation, the corner-point is in the non-linear region of operation, thereby reducing the SINAD of the demodulated signal. By contrast, a five (5) all-pass filter implementation moves the corner point into the linear region of the all-pass filters 600.

Using all-pass filters 600 that provide the same amount of phase shift is advantageous because it allows a single all-pass filter 600 design with the same circuit components to be used for all of the all-pass filters 600. However, the amount of phase shift provided by each all-pass filter may vary depending upon the requirements of a particular application.

According to one embodiment of the invention, the all-pass filters 600 in the phase shifter network 504 provide different amounts of phase shift, while the total amount of phase shift (ninety degrees) remains the same. For example, for a particular five all-pass filter 600 implementation, four of the five all-pass filters 600 provide twenty (20) degrees of phase shift and the fifth all-pass filter 600 provides ten (10) degrees of phase shift. Other combinations of phase shift may also be used.

Figure 8:
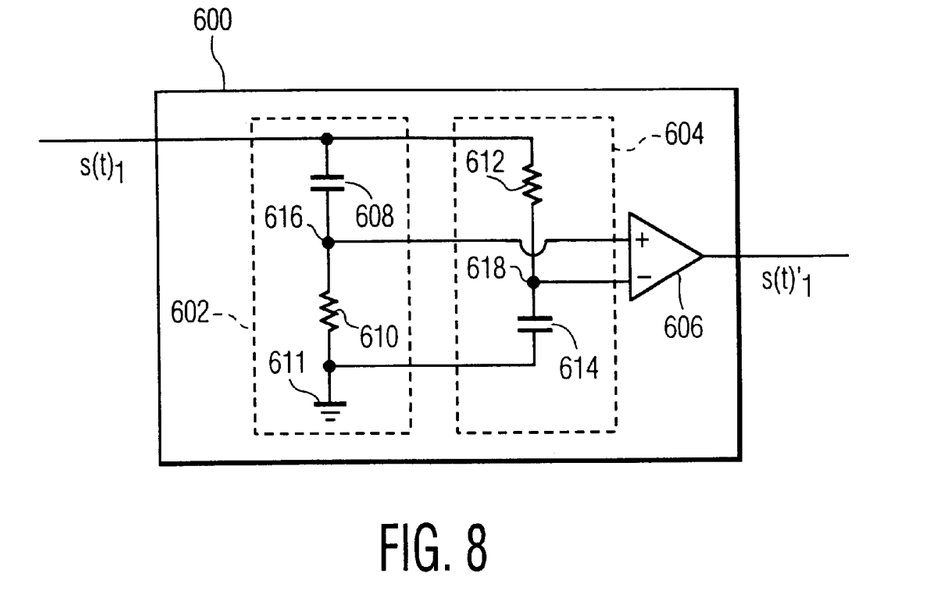
FIG. 8 is a circuit schematic illustrating the implementation of an all-pass filter according to an embodiment of the invention.

FIG. 8 illustrates a circuit implementation of an all-pass filter 600 according to an embodiment of the invention. All-pass filter 600 includes a first resistor-capacitor (RC) pair 602, a second RC pair 604 and an output buffer 606 connected in series between input signal $s(t)_1$ and output signal $s(t)_1'$. Output signal $s(t)_1'$ represents $s(t)_1$ after being processed by all-pass filter 600. First RC pair 602 includes a capacitor 608 connected in series with a resistor 610 between $s(t)_1$ and a ground 611. Second RC pair 604 includes a resistor 612 connected in series with a capacitor 614 between $s(t)_1$ and ground 611. Output buffer 606 is preferably a unity-gain amplifier having non-inverting (+) and inverting (−) inputs and a gain of one (1). The non-inverting input (+) of output buffer 606 is connected to a node 616 between capacitor 608 and resistor 610. The inverting input of output buffer 606, designated by (−) is connected to a node 618 between resistor 612 and capacitor 614. Output buffer 606 provides s(t)$_1$' at its output. The operation of the circuit implementation all-pass filter 600 as illustrated in FIG. 8 is characterized by the following equations:

$$\theta(f) = 2\tan^{-1}\left(\frac{1}{2\pi RCf}\right) \quad (3)$$

$$RC = \frac{1}{2\pi f_{IF}} \quad (4)$$

$$\left|\frac{V_{out}(f)}{V_{in}(f)}\right| = 1 \text{ (all - pass)} \quad (5)$$

$$Q=1 \quad (6)$$

The component values for capacitor 608, resistor 610, resistor 612 and capacitor 614 are selected depending upon the particular requirements of an application. In one such application, the all-pass filter 600 as implemented in FIG. 8 produces a SINAD of 30 dB for s(t)$_1$' when the center frequency $f_{IF}$ of s(t)$_1$ is approximately 60 KHz. In this application the range of component values selected for capacitor 608, resistor 610, resistor 612 and capacitor 614 are as follows: capacitor 608: 5 pF; resistor 610: 100K ohms; resistor 612: 100K ohms; and capacitor 614 5 pF. Embodiments of the invention are especially applicable to modulated signals having a frequency of about 10 KHz to about 200 KHz, depending upon the component values used, although the invention may also be applied to modulated signals with different frequencies.

For some telecommunication applications, for example cellular telephony, a SINAD of 30 dB does not provide sufficient power margin needed for adequate performance, for example group delay spread. Therefore, in accordance with an embodiment of the invention as illustrated in FIG. 6 and previously described, multiple all-pass filters 600 are employed to reduce the distortion in s(t)$_2$ and m(t).

The operation of a phase shifter network 504 containing five (5) all-pass filters 600 is characterized by the following equations:

$$RC = \frac{1}{2\pi f_{90°}} \quad (7)$$

$$f_{90°} = \frac{f_{IF}}{\tan\left(\frac{\pi}{4N}\right)} \quad (8)$$

A phase shifter network 504 containing five (5) all-pass filters 600 such as that illustrated in FIG. 8 produces a SINAD of approximately 55 dB for s(t)$_1$' when the center frequency $f_{IF}$ of s(t)$_1$ is approximately 60 KHz, providing a demodulator 500 suitable for many telecommunication applications, such as wireless telephony. Advantageously, the phase shifter network 504 containing five (5) all-pass filters 600 as illustrated in FIG. 8 does not require the use of inductors or a limiter between phase shifter network 504 and mixer 506, making phase shifter network 504 particularly useful for integrated circuit solutions where limited component space is available.

Low-Pass Bessel Filter

Figure 9:
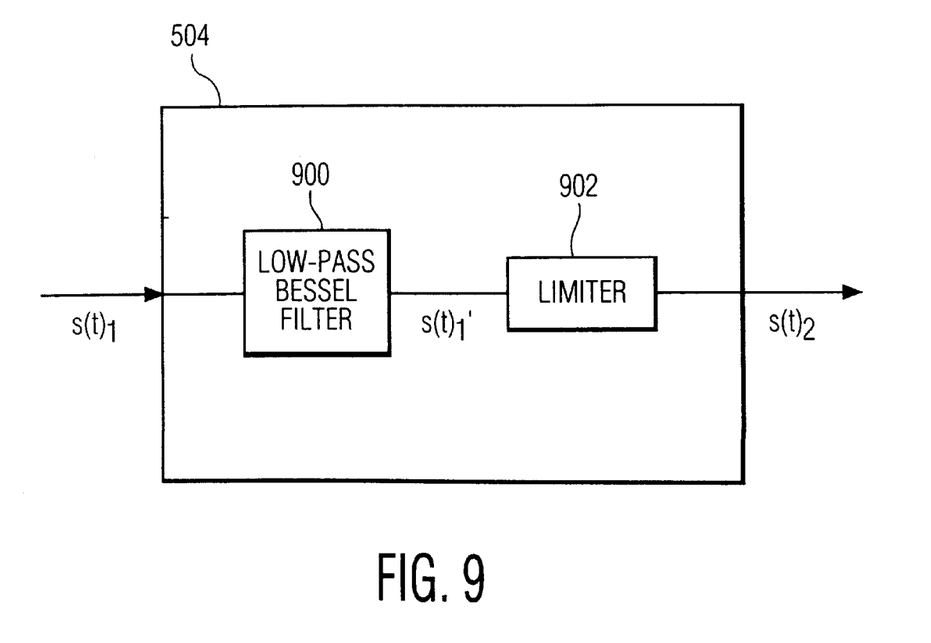
FIG. 9 is a block diagram illustrating a phase shifter network according to another embodiment of the invention.

FIG. 9 illustrates phase shifter network 504 according to another embodiment of the invention. Phase shifter network 504 is implemented with a low-pass bessel filter 900 and a limiter 902. Low-pass bessel filter 900 processes input signal s(t)$_1$ and provides a phase-shifted signal s(t)$_1$' with relatively low group-delay distortion. Limiter 902 processes signal s(t)$_1$' by compensating for any amplitude variations in signal s(t)$_1$' contributed by low-pass bessel filter 900 and provides output signal s(t)$_2$.

According to the low-pass bessel filter 900 implementation of FIG. 9, the linearity of output signal s(t)$_2$ is varied by the order of low-pass bessel filter 900 selected. A third order low-pass bessel filter 900 has been found to provide a linear phase change over at least ninety (90) degrees up to the center frequency ($f_{IF}$) of signal s(t)$_1$ with relatively low distortion. Low-pass bessel filter 900 has a similar transfer function as all-pass filter 600 of FIG. 8. Other order bessel filters may be used depending upon the requirements of a particular application.

Figure 10:
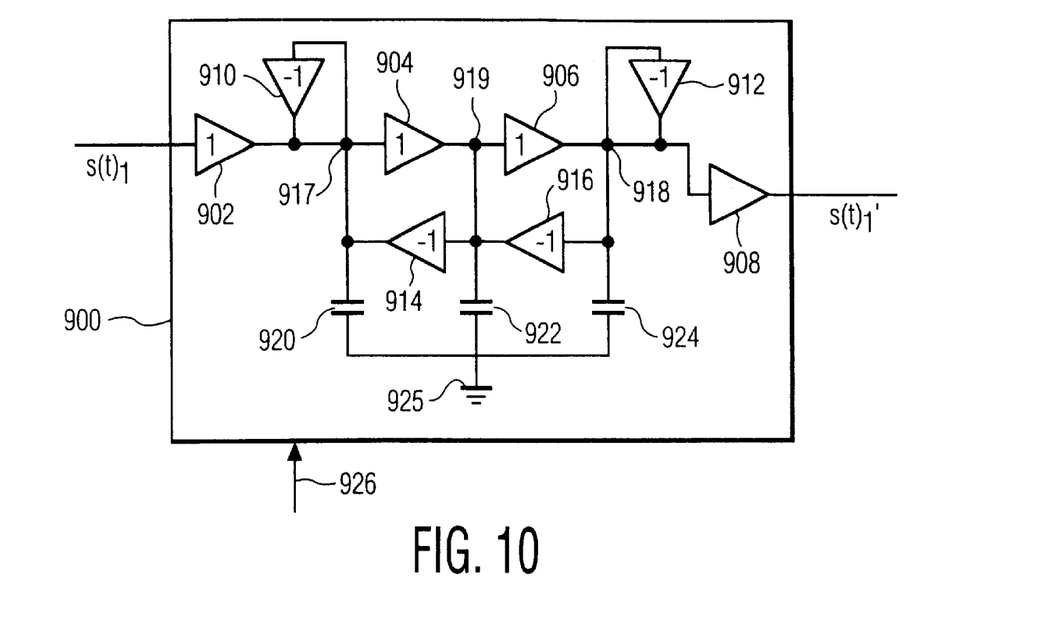
FIG. 10 is a circuit schematic illustrating a low-pass bessel filter according to an embodiment of the invention.
Figure 11A:
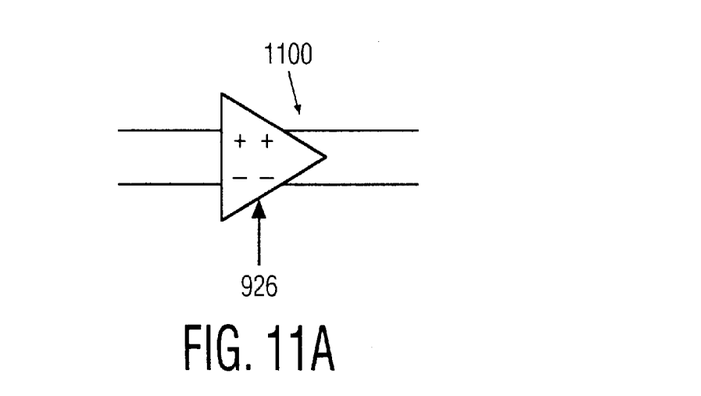
FIG. 11A is a block diagram of a non-inverting gm cell according to an embodiment of the invention.
Figure 11B:
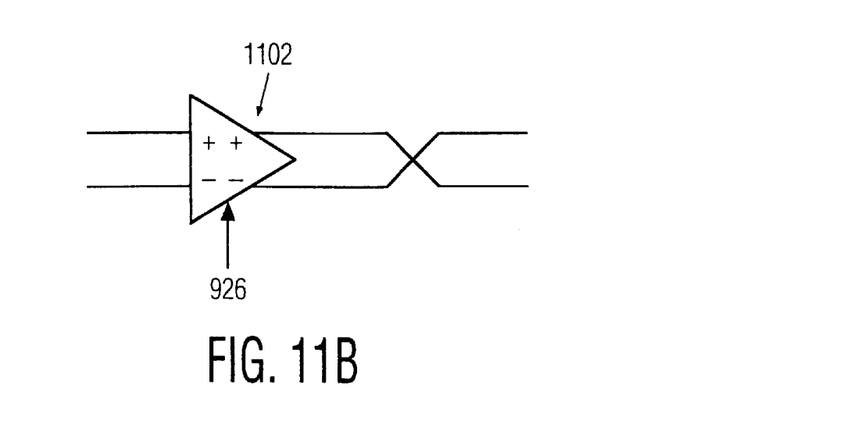
FIG. 11B is a block diagram of an inverting gm cell according to an embodiment of the invention.

FIG. 10 illustrates a circuit implementation of a third order low-pass bessel filter 900 using gm cells according to an embodiment of the invention. Gm cells, also known as transconductance cells or voltage-to-current converters, are well known in the art and are used to transform an input voltage into an output current. All of the gm cells in FIG. 10 are illustrated with a single signal input and single signal output for simplicity. As is well known in the art and illustrated in FIGS. 11A and 11B, gm cells actually have two inputs and two outputs. FIG. 11A illustrates a conventional non-inverting gm cell 1100 used for gm cells 902, 904 and 906 of FIG. 10. FIG. 11B illustrates a symbolic representation of a conventional inverting gm cell 1102 with inverted outputs.

Low-pass bessel filter 900 includes non-inverting gm cells 902, 904 and 906 connected in series with an output buffer 908 between input signal s(t)$_1$ and output signal s(t)$_2$. Low-pass bessel filter 900 also includes inverting gin cells 910, 912, 914 and 916. Inverting gin cell 910 is connected in parallel between the input of non-inverting gm cell 904 and the output of non-inverting gm cell 902 at a node 917. Inverting gm cell 912 is connected in parallel between the output of non-inverting gm cell 906 and the input of output buffer 908 at a node 918. Inverting gm cell 914 is connected in parallel with non-inverting gm cell 904 between node 917 and a node 919. Inverting gm cell 916 is connected in parallel with non-inverting gm cell 906 between node 918 and node 919.

Low-pass bessel filter 900 also includes capacitors 920, 922 and 924. Capacitor 920 is connected between node 917 and a ground 925. Capacitor 922 is connected between node 919 and ground 925. Capacitor 924 is connected between node 918 and ground 925.

According to another embodiment of the invention, a tune input 926 is connected to each gm cell 902, 904, 906, 910, 912, 914 and 916 as illustrated in FIGS. 10, 11A and 11B. For simplicity and clarity, tune input 926 is shown as a single connection connected to low-pass bessel filter 900 but is actually connected to each gm cell 902, 904, 906, 910, 912, 914 and 916 as illustrated in FIGS. 11A and 11B. Tune input 926 adjusts the voltage to current conversion operation of the gm cells 902, 904, 906, 910, 912, 914 and 916 to account for changes in component values and/or parasitic capacitances in low-pass bessel filter 900. Tune input 926 allows the operation of low-pass bessel filter 900 to be "tuned" so that the input signal s(t)$_1$ is phase shifted by ninety (90)

degrees at the center frequency ($f_{IF}$) of input signal $s(t)_1$. Importantly, tune input 926 allows low-pass bessel filter 900 to be dynamically tuned during operation by other circuitry (not illustrated) that calibrates the c/gm time constant by using a reference clock and adjusts the voltage on tune input 926 to maintain a ninety (90) degree phase shift.

The operation of a normalized low-pass bessel filter 900 as illustrated in FIG. 10 is characterized by the following equation:

$$f(s) = \frac{1}{\frac{\sinh(s)}{1 + \cosh(s)/\sinh(s)}}$$

The values of capacitors 920, 922 and 924 are selected depending upon the requirements of a particular application. According to one such application the values for capacitors 920, 922 and 924 are in the range of about 1 to about 15 pico farads (pf), which is suitable for integrated applications.

Figure 12:
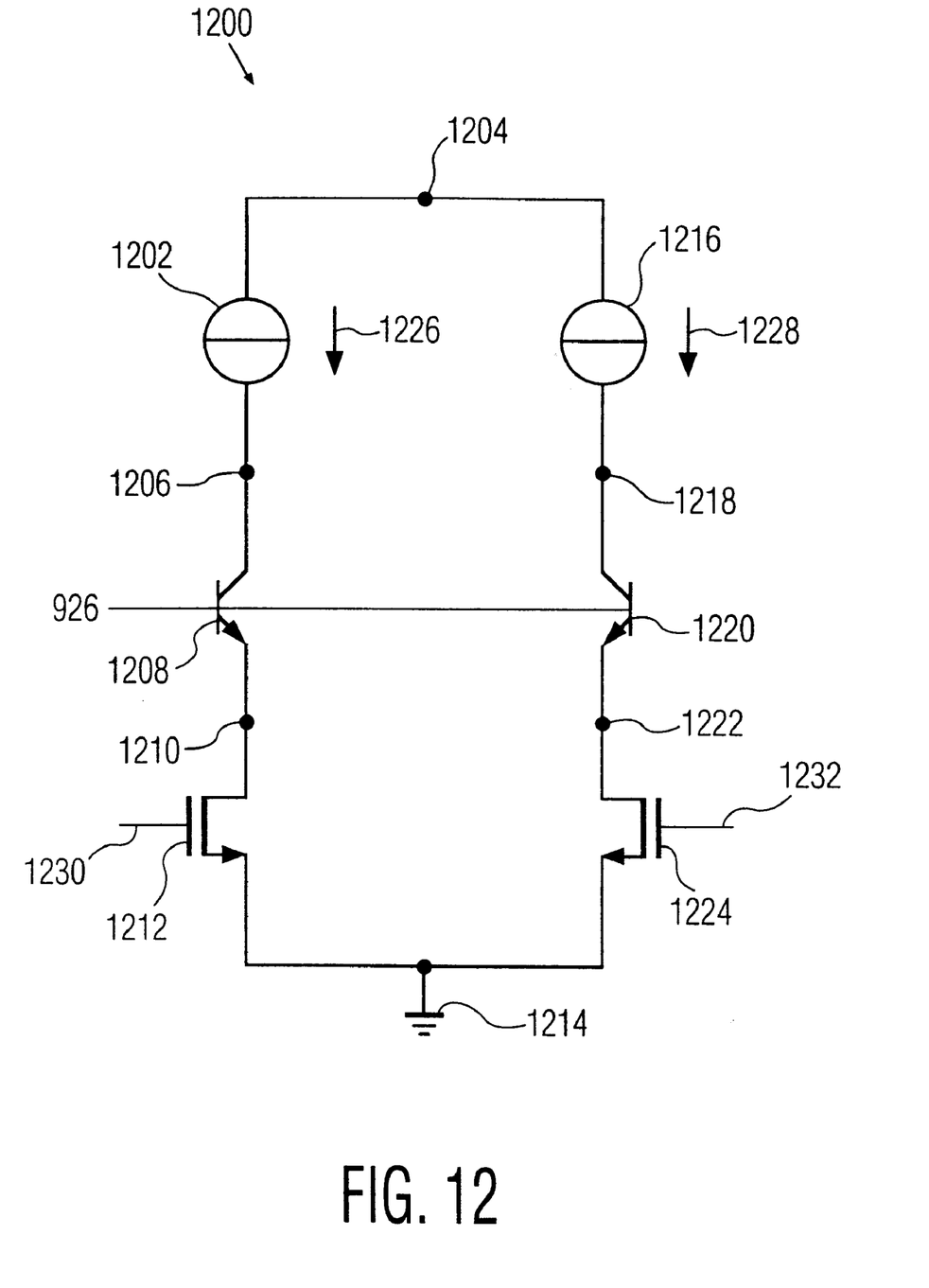
FIG. 12 is a circuit schematic illustrating a circuit implementation of a gm cell according to an embodiment of the invention.

FIG. 12 illustrates a circuit implementation of a gm cell 1200 according to an embodiment of the invention. Gm cell 1200 includes a current source 1202 connected between a node 1204 and a node 1206. Node 1204 is connected to a voltage source such as a 2.7 volt supply. Gm cell 1200 further includes a NPN-type transistor 1208 connected between node 1206 and a node 1210. An NMOSFET transistor 1212 is connected between node 1210 and a ground 1214.

Gm cell 1200 includes a current source 1216 connected between node 1204 and a node 1218. An NPN-type transistor 1220 is connected between node 1218 and a node 1222. An NMOSFET transistor 1224 is connected between node 1222 and ground 1214. Current source 1202 produces a bias current flowing in the direction indicated by arrow 1226. Current source 1216 produces a bias current flowing in the direction indicated by arrow 1228.

Gm cell 1200 provides a negative output current ($I_{OUT}-$) at node 1206 and a positive output current ($I_{OUT}+$) at node 1218. Tune input 926 is connected to the gate inputs of NPN-type transistors 1208 and 1220. A gate input 1230 of NMOSFET transistor 1212 is connected to a positive input voltage ($V_{IN}+$) of gm cell 1200. A gate input 1232 of NPN-type transistor 1224 is connected to a negative input voltage ($V_{IN}-$) of gm cell 1200.

Although the embodiment of low-pass bessel filter 900 is illustrated and described in the context of a third-order bessel filter, other order bessel filters may be used depending upon the requirements of a particular application. For example, for some applications where the linearity requirements are not as stringent, a lower order bessel filter, such as second order bessel filter may be used, albeit at the cost of possibly providing a less linear phase change of output signal $s(t)_2$ over frequencies up to the center frequency of the input signal $s(t)_1$. Other applications may require more stringent linearity over a different phase change and therefore a higher order bessel filter, such as a fifth order bessel filter, may be used.

The techniques described herein provide several advantages over prior approaches for demodulating a frequency-modulated signal. Most significantly, the embodiments described herein provide a linear phase change of ninety (90) degrees up to the center frequency ($f_{IF}$) of the input signal with relatively minimal amplitude or frequency distortion. The use of inductors is avoided allowing for a reduced implementation size that is particularly usefull in integrated circuit applications. The all-pass filter embodiment does not require the use of an additional limiter stage after phase network shifter 504 further reducing the number of required components. Finally, tune input 926 allows the operation of low-pass bessel filter 900 to be dynamically adjusted so that the input signal $s(t)_1$ is phase shifted by ninety (90) degrees at the center frequency ($f_{IF}$) of input signal $s(t)_1$.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A demodulator for processing a frequency-modulated input signal and providing a demodulated output signal, the demodulator comprising:

a limiter responsive to a frequency-modulated input signal for providing a limited-amplitude signal having a predetermined amplitude;

a phase shifter network coupled to the limiter and including a plurality of cascaded filters each providing a predetermined phase shift at a center frequency and operating in a linear region, the phase shifter network being responsive to the limited amplitude signal to provide a phase-shifted limited amplitude signal having a phase shift equal to the sum of the phase shifts of the plurality of filters; and a signal mixer coupled to both the limiter and the phase shifter network, the signal mixer being responsive to both the limited amplitude signal and the phase-shifted limited amplitude signal to generate a demodulated output signal having a limited amplitude signal component and a phase-shifted limited amplitude signal component.

2. The demodulator as recited in claim 1, further comprising a filter coupled to the mixer, the filter being responsive to the output signal for providing a filtered output signal.

3. The demodulator as recited in claim 1, wherein the plurality of filters comprises a plurality of all-pass filters configured to provide a total phase shift of the limited amplitude signal of ninety (90) degrees.

4. The demodulator as recited in claim 3, wherein the plurality of all-pass filters comprises five all-pass filters that are each configured to provide a phase shift of the limited amplitude signal of eighteen (18) degrees.

5. A demodulator as recited in claim 3, wherein each all-pass filter comprises a circuit having an input and an output and comprising a first resistor-capacitor (RC) pair, a second RC pair and a unity-gain amplifier (AMP), the first RC pair being connected in series between the input and a ground, the capacitor of the first RC pair being connected to the input and the resistor of the first RC pair being connected to ground, the second RC pair being connected in parallel with the first RC pair between the input and the ground, the resistor in the second RC pair being connected to the input and the capacitor in the second RC pair being connected to the ground, a non-inverting input of the AMP being connected between the resistor and capacitor in the first RC pair and an inverting input of the AMP being connected between the resistor and capacitor of the second RC pair.

6. A method for processing a frequency-modulated signal and providing an output signal, the method comprising the steps of:

processing the frequency-modulated signal to generate a limited-amplitude signal having a predetermined amplitude;

processing the limited-amplitude signal with a plurality of cascaded all-pass filters each providing a phase shift at a center frequency to generate a phase-shifted limited amplitude signal having a phase shift at the center frequency equal to the sum of the phase shifts of the plurality of filters; and processing the limited-amplitude signal and the phase-shifted limited amplitude signal to generate an output signal having a limited amplitude signal component and a phase-shifted limited amplitude component.

7. The method as recited in claim 6, further including the step of filtering the output signal to generate a filtered output signal.

8. The method as recited in claim 6, wherein the step of processing the limited-amplitude signal with a plurality of all-pass filters involves phase shifting the limited-amplitude signal by ninety (90) degrees.

9. The method as recited in claim 6, wherein:

the plurality of all-pass filters includes N number of all-pass filters, and the step of processing the limited-amplitude signal with a plurality of all-pass filters includes the step of processing the limited-amplitude signal with N number of all-pass filters to generate a phase-shifted limited amplitude signal having a phase shift of ninety (90) degrees with respect to the limited amplitude signal, wherein each of the N number of all-pass filters causes a phase shift of (90/N) degrees of the limited-amplitude signal.

10. A demodulator for processing a frequency-modulated input signal and providing an output signal, the demodulator comprising:

a first limiter responsive to a frequency-modulated input signal for providing a limited-amplitude signal having a predetermined amplitude;

a low-pass bessel filter coupled to the limiter, the low-pass bessel filter being responsive to the limited-amplitude signal for generating a first phase-shifted limited-amplitude signal;

a second limiter coupled to the low-pass bessel filter and being responsive to the first phase-shifted limited-amplitude signal for generating a second phase-shifted limited-amplitude signal; and a signal mixer coupled to both the first limiter and the second limiter, the signal mixer being responsive to the limited-amplitude signal and the second phase-shifted limited-amplitude signal for generating an output signal having a limited amplitude signal component and a phase-shifted limited amplitude signal component.

11. The demodulator as recited in claim 10, further comprising a filter coupled to the mixer, the filter being responsive to the output signal for providing a filtered output signal.

12. The demodulator as recited in claim 10, wherein the low-pass bessel filter is a third order low-pass bessel filter.

13. The demodulator as recited in claim 12, wherein the third order low-pass bessel filter comprises a plurality of gm cells.

14. The demodulator as recited in claim 13, wherein the third order low-pass bessel filter comprises:

an input and an output;

first, second, third non-inverting gm cells and an output buffer connected in series between the input and the output;

a first inverting gin cell connected in parallel with the first and second non-inverting gm cells at a first node located between the first and second non-inverting gm cells;

a second inverting gm cell connected in parallel with the third non-inverting gm cell and the output buffer at a second node between the third non-inverting gm cell and the output buffer;

a third inverting gm cell connected between a third node between the second and third non-inverting gin cells and the first node;

a fourth inverting gm cell connected between the second node and the third node;

a first capacitor connected between the first node and a ground;

a second capacitor connected between the second node and the ground; and a third capacitor connected between the third node and the ground.

15. A low distortion phase shift network suitable for use in an integrated circuit, said network comprising:

a plurality of all pass filters coupled in cascade wherein each of the all pass filters provides a phase shift of less than 90 degrees at a center frequency and the cascaded plurality of all pass filters provides an overall phase shift of 90 degrees at the center frequency, and wherein each all-pass filter comprises:

an input and an output; and a first resistor-capacitor (RC) pair, a second RC pair and a unity-gain amplifier (AMP), the first RC pair being connected in series between the input and a ground, the capacitor of the first RC pair being connected to the input and the resistor of the first RC pair being connected to ground, the second RC pair being connected in parallel with the first RC pair between the input and the ground, the resistor in the second RC pair being connected to the input and the capacitor in the second RC pair being connected to the ground, a non-inverting input of the AMP being connected between the resistor and capacitor in the first RC pair and an inverting input of the AMP being connected between the resistor and capacitor of the second RC pair.

16. The phase shift network of claim 15, comprising a number N of all pass filters wherein each all pass filter provides a phase shift of 90/N degrees.

17. The phase shift network of claim 16, wherein each said all pass filter is an RC filter.

18. The phase shift network of claim 15, wherein each said all pass filter is an RC filter.

19. A phase shift network suitable for use in an FM demodulator, said network comprising:

a plurality of all pass filters coupled in cascade wherein each of the all pass filters provides a phase shift of less than 90 degrees at a center frequency and the cascaded plurality of all pass filters provide an overall phase shift of 90 degrees at the center frequency, wherein the output signal of each all pass filter has an essentially constant amplitude response over a desired band of frequencies.

20. The phase shift network of claim 19, comprising:

a limiter responsive to a frequency-modulated input signal and which provides a limited amplitude signal;

said low distortion phase shift network receiving the limited amplitude signal from said limiter and providing a phase-shifted limited amplitude signal with an overall phase shift of 90 degrees; and a mixer having a first input coupled to said limiter and a second input coupled to said phase shift network, said mixer being responsive to both the limited amplitude signal and the phase-shifted limited amplitude signal to generate a demodulated output signal.

21. The phase shift network of claim 20, wherein said phase shift network comprises a number N of all pass filters wherein each all pass filter provides a phase shift of 90/N degrees.

22. The phase shift network of claim 21, wherein each said all pass filter is an RC filter.

23. The phase shift network of claim 19, wherein each said all pass filter is an RC filter.

24. The phase shift network of claim 19, wherein said phase shift network comprises a number N of all pass filters wherein each all pass filter provides a phase shift of 90/N degrees.

25. The phase shift network as claimed in claim 19, wherein the desired band of frequencies is between about 10 KHz to 200 KHz.

26. The low distortion phase shift network as claimed in claim 15, wherein the resistance of the first resistor in the first RC pair equals the resistance of the second resistor in the second RC pair, and the reactance of the first capacitor in the first RC pair equals the reactance of the second capacitor in the second RC pair.

* * * * *